United States Patent
Hackl et al.

(10) Patent No.: US 10,530,149 B2
(45) Date of Patent: Jan. 7, 2020

(54) METHODS FOR DETECTING AN INTERRUPTION OF AN ACTIVE CONDUCTOR IN AN UNGROUNDED DIRECT-VOLTAGE POWER SUPPLY SYSTEM

(71) Applicant: Bender GmbH & Co. KG, Gruenberg (DE)

(72) Inventors: Dieter Hackl, Fernwald (DE); Burkhard Macht, Hungen (DE)

(73) Assignee: BENDER GMBH & CO. KG, Gruenberg (DE)

( * ) Notice: Subject to any disclaimer, the term of this patent is extended or adjusted under 35 U.S.C. 154(b) by 472 days.

(21) Appl. No.: 15/396,883

(22) Filed: Jan. 3, 2017

(65) Prior Publication Data
US 2017/0201090 A1    Jul. 13, 2017

(30) Foreign Application Priority Data

Jan. 13, 2016   (DE) .................. 10 2016 200 309

(51) Int. Cl.
*H02H 7/22*       (2006.01)
*G01R 31/02*      (2006.01)
*H02H 3/20*       (2006.01)

(52) U.S. Cl.
CPC ........... *H02H 7/226* (2013.01); *G01R 31/021* (2013.01); *G01R 31/026* (2013.01); *H02H 3/202* (2013.01)

(58) Field of Classification Search
CPC ...... H02H 7/226; H02H 3/202; G01R 31/021; G01R 31/026

USPC ......... 361/63, 65, 91.1, 91.2, 93.7; 340/647, 340/650; 324/519, 522, 525, 551, 691
See application file for complete search history.

(56) References Cited

U.S. PATENT DOCUMENTS

| | | | |
|---|---|---|---|
| 4,066,950 A * | 1/1978 | Rumold ................. | G01R 27/18 324/509 |
| 4,253,056 A * | 2/1981 | Chaudhary .......... | G01R 31/025 324/140 R |
| 4,638,245 A | 1/1987 | MacPhee et al. | |
| 4,837,519 A | 6/1989 | Lopetrone et al. | |
| 4,929,901 A | 5/1990 | Kimball et al. | |
| 5,514,964 A * | 5/1996 | Benesh ................. | G01R 27/18 324/509 |
| 5,530,363 A * | 6/1996 | Gaughan ............. | G01R 31/025 324/117 H |
| 5,818,236 A | 10/1998 | Sone et al. | |
| 6,459,998 B1 | 10/2002 | Hoffman | |

(Continued)

FOREIGN PATENT DOCUMENTS

| DE | 19621567 | 1/1997 |
|---|---|---|
| DE | 19826410 A1 | 1/1999 |

(Continued)

*Primary Examiner* — Scott Bauer
(74) *Attorney, Agent, or Firm* — King & Schickli, PLLC

(57) ABSTRACT

The invention relates to a method for detecting an interruption of an active conductor in an ungrounded direct-voltage power supply system. Five alternative methods are introduced, which are based on determining a current load current, a current total insulation resistance, a current displacement voltage, a current total capacitance or a current total impedance. Each of these methods minimizes the hazard related to accidental touching of two active conductors in an ungrounded direct-voltage power supply system.

18 Claims, 5 Drawing Sheets

(56) References Cited

U.S. PATENT DOCUMENTS

Figure 1:
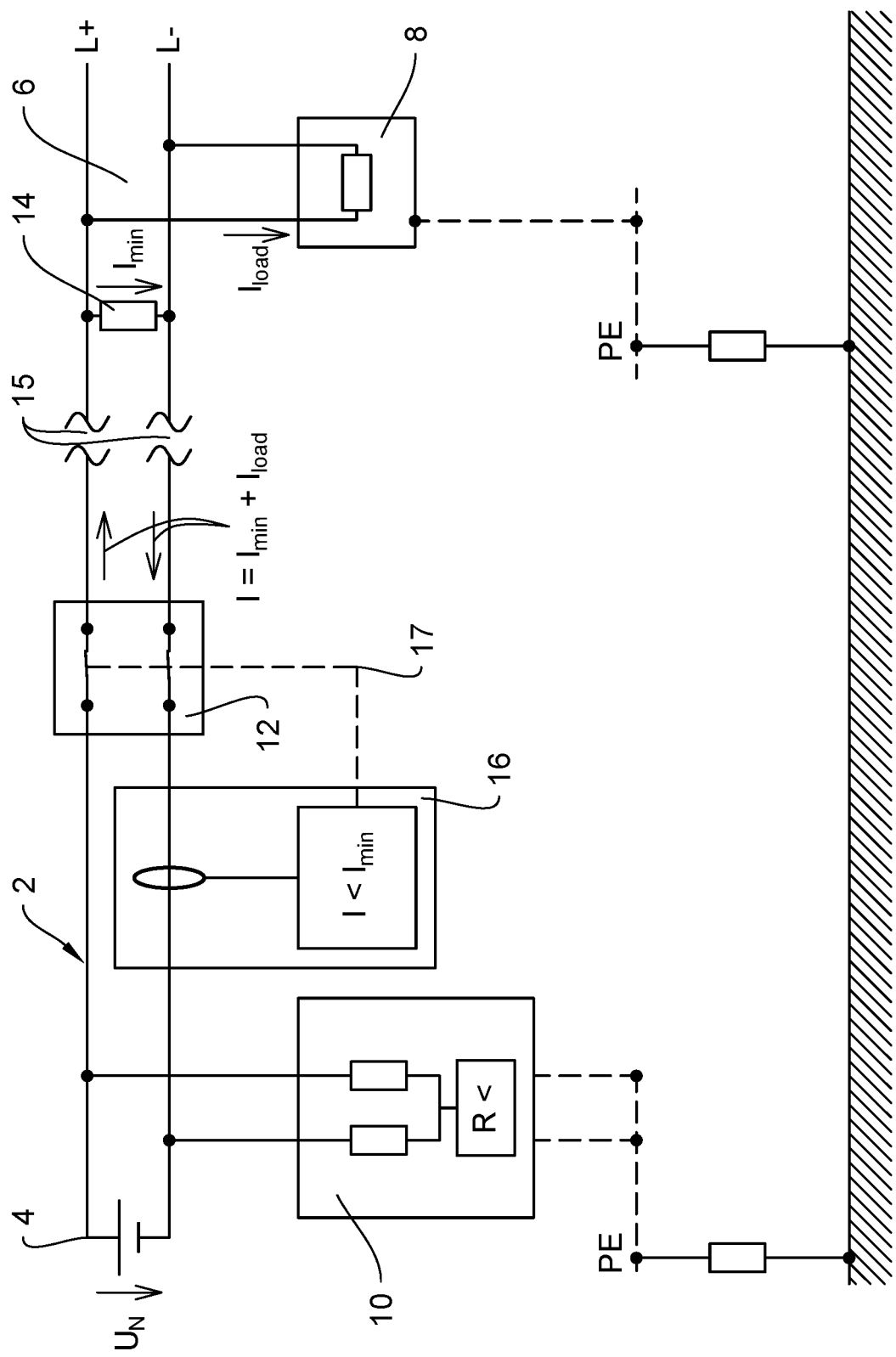

| | | | | |
|---|---|---|---|---|
| 7,049,825 B2 * | 5/2006 | Carruthers | ............. | G01R 27/18 |
| | | | | 324/509 |
| 8,559,142 B2 * | 10/2013 | Liu | .................... | G01R 31/1227 |
| | | | | 324/509 |
| 8,643,383 B2 * | 2/2014 | Xiao | .................... | H02H 7/1203 |
| | | | | 318/445 |
| 10,191,101 B2 * | 1/2019 | Dong | .................... | G01R 31/025 |
| 2003/0234653 A1 * | 12/2003 | Kollenda | ............. | G01R 31/025 |
| | | | | 324/551 |
| 2008/0084215 A1 | 4/2008 | Itten et al. | | |
| 2012/0221269 A1 * | 8/2012 | Wanner | ................ | G01R 31/025 |
| | | | | 702/65 |
| 2013/0342215 A1 * | 12/2013 | Kawamura | .......... | G01R 31/025 |
| | | | | 324/509 |
| 2015/0285850 A1 * | 10/2015 | Liu | ...................... | G01R 27/025 |
| | | | | 324/551 |
| 2017/0201090 A1 * | 7/2017 | Hackl | ................. | G01R 31/021 |

FOREIGN PATENT DOCUMENTS

| | | |
|---|---|---|
| DE | 69637279 T2 | 7/2008 |
| EP | 1586910 | 10/2005 |
| EP | 2796886 A1 | 10/2014 |

* cited by examiner

METHODS FOR DETECTING AN INTERRUPTION OF AN ACTIVE CONDUCTOR IN AN UNGROUNDED DIRECT-VOLTAGE POWER SUPPLY SYSTEM

The disclosure of German Patent Application no. 10 2016 200 309.7 filed Jan. 13, 2016 is incorporated herein by reference.

TECHNICAL FIELD

The invention relates to a method for detecting an interruption of an active conductor in an ungrounded direct-voltage power supply system.

BACKGROUND

In situations where higher requirements in terms of operational, fire and contact safety have to be met when supplying electrical equipment (loads) with energy, the network type of an ungrounded power supply system is used. This network type is also known as an insulated network or IT system (French: isolé terre—IT). In this kind of power supply system, the active parts are separated from the ground potential, i.e. against ground. The advantage of these networks is that the IT power supply system can continue to operate in case of a first insulation fault, such as a fault to ground or a fault to frame, because the ideally infinitely large impedance value prevents a closed (fault) circuit from forming between the active conductors (outer conductors and potentially present neutral conductor) of the network and ground in this first fault case.

The inherent safety of the IT power supply system thus can ensure a continuous power supply of the equipment connected to the IT power supply system, i.e. of the loads fed by the IT power supply system, even if a first insulation fault occurs.

Hence, as a solution conserving energy and material, the IT power supply system in its configuration as a 400 V direct-voltage IT power supply system (DC-IT power supply system) including modern converter technology is also increasingly used in the field of telecommunication. There, the 400 VDC voltage is often led through kilometer-long lines toward the equipment. To save material costs, the protective conductor is omitted. The protective grounding of conductive, touchable parts of the equipment happens on site via an existing grounding of the building, similar to the independent grounding of equipment in the network type of the TT system (French: terre terre—TT).

A line break in such an extensive IT power supply system poses the risk of direct touching of an active conductor of the power supply system and may thus lead to a hazard to persons. Direct touching of one or both active conductors would not be safely detectable by a residual current device in the DC-IT power supply system because the fault circuit is not closed in an IT power supply system. While there should be no shock current in case of direct touching of only one active conductor in a DC-IT power supply system with a high level of insulation and little network leakage capacitances, direct touching of two active conductors is hazardous in a DC-IT power supply system, as well.

Even if an insulation monitoring device is used in a DC-IT power supply system to shut off the power supply in case of a first fault, i.e. upon triggering of a (main) alarm due to an insulation resistance falling short of an insulation resistance value, in most insulation monitoring devices, the automatic shut-off of the power supply upon direct touching of both active conductors will not be able to fulfill the protective measures required according to harmonized standard HD 60364-4-41:2007 "Low-voltage electrical installations—Part 4-41: Protection for safety—Protection against electric shock" for protection against electric shock.

If simultaneous touching of two active conductors in an IT power supply system is recognized as an inacceptable residual risk in the course of a risk assessment, measures have to be taken to reduce said residual risk.

Protective measures applied thus far, such as double or reinforced insulation or such as protection by safety extra low voltage (SELV) or by protective extra low voltage (PELV), are often contrary to the requirements to be met by a power supply system regarding supply reliability and in view of cost aspects.

For instance, the protective measures provided by SELV or PELV are often used in the field of telecommunication, too; however, they will no longer applicable because of their low voltages if 400 VDC power supply systems are to be employed for reasons of energy and material efficiency.

Thus, the object of the present invention is to provide a technical solution that minimizes the hazard in case of accidental touching of two active conductors in an ungrounded direct-voltage power supply system.

SUMMARY

In a first alternative, this object is attained by a method comprising the following method steps according to the invention: connecting an ohmic minimal load to generate a minimal load current on the active conductors, determining a current load current, checking whether the current load current falls short of the value of the minimal load current, and signaling a shortfall.

In order to generate a minimal load current flow on the active conductors during operation of the DC-IT power supply system, a minimal load is introduced into the power supply system as a basic load close to the load, i.e. in the immediate vicinity of the actual equipment/load connection, if possible.

The momentary current flow in the power supply system is continuously determined during operation in the sense of monitoring of the current load current and has at least the value of the minimal load current owing to the connected minimal load. If now an interruption of an active conductor occurs because of a line break, for example, the minimal load current can no longer flow, either. The measured current load current drops to a magnitude close to zero and thus falls short of the value of the minimal load current.

This shortfall thus provides a clear indication of an interruption of an active conductor and is signaled. Signaling can happen in the form of a warning message, in reaction to which corresponding further measures can be taken in order to ensure the electrical safety of the installation. Signaling can also comprise generating a shut-off signal, which, in connection with a shut-off means or an undercurrent relay (see below), triggers an automatic shut-off of the power supply system.

As another advantage, false shut-offs due to load fluctuations occurring during normal operation of the power supply system are avoided because there is always a minimal load current running due to the load-near connection of the minimal load.

In an extended embodiment of the method, the power supply system is shut off by means of an undercurrent relay if the load current falls short of a minimal load-current value.

With regard to further risk minimization, signaling of the load current falling short of the minimal load-current value is connected with an automatic shut-off of the power supply system. An undercurrent relay detects that the load current falls short of the minimal load-current value, said step also implicitly comprising determination of the current load current. If said shortfall is detected, the undercurrent relay is triggered and the power supply system is shut off. In combination with an AC/DC-sensitive measuring current transformer connected to the undercurrent relay, the method according to the first alternative solution can be directly implemented in a simple manner.

In a second alternative, the object is attained by a method that comprises the following method steps according to the invention: connecting a high-resistance resistor between each active conductor an ground, determining a current total insulation resistance of the power supply system by means of an insulation monitoring device, checking whether the current total insulation resistance exceeds a limit value, and signaling an exceedance.

In this alternative, a high-resistance resistor is connected between each active conductor and ground close to the load. The resistors are configured to have a high resistance that, while not affecting the nature of the supply network that makes it an ungrounded power supply system, cannot be neglected when considering the total insulation resistance.

If an active conductor is interrupted, the current path via the inserted high-resistance resistor is interrupted as well, the total insulation resistance thus being increased.

At the feeding side, the current total insulation resistance of the power supply system is determined by means of an insulation monitoring device and is checked as to whether the current total insulation resistance exceeds a limit value. Exceedance of the limit value and thus information regarding the operating state of the power supply system are signaled.

The method according to the second alternative solution is directly applicable in all DC-IT power supply systems in which an insulation monitoring device required by standards and configured according to standards is installed.

In another embodiment, the total-insulation-resistance limit value is defined as a function of an insulation resistance value specific to the power supply system and as a function of the connected high-resistance resistors.

The total-insulation-resistance limit value, upon exceedance of which a potential hazard is signaled, results from an insulation level individual to the power supply system in question and represented by a specific insulation resistance value and from the high-resistance resistors connected close to the load.

Advantageously, the power supply system is shut off if the total-insulation-resistance limit value is exceeded.

Signaling also directly comprises automatic shut-off of the power supply in order to preclude any hazard from touching of active installation parts.

In a third alternative, the object is attained by a method that comprises the following method steps according to the invention: connecting a high-resistance resistor between each active conductor and ground, determining a current displacement voltage between an interconnected point of all active conductors and ground, checking whether the current displacement voltage exceeds a limit value, and signaling an exceedance.

As in the second method, a high-resistance resistor is connected between each active conductor and ground close to the load. At the feeding side, a current displacement voltage is continuously determined in the sense of monitoring between an interconnected point of all active conductors, which is comparable to a neutral point, and ground. In case of an interruption of at least one active conductor, a raised value of the displacement voltage is measured, allowing an interruption of an active conductor to be detected through a comparison between the current displacement voltage and a displacement-voltage limit value and a hazardous state to be signaled in case of an exceedance of the displacement-voltage limit value.

In another embodiment, the displacement-voltage limit value is defined as a function of an insulation resistance value specific to the power supply system and as a function of the connected high-resistance resistor(s) and as a function of a nominal voltage of the power supply system.

To define the displacement-voltage limit value upon whose exceedance a potential hazard is signaled, the following variables are taken into account: the individual insulation level of the IT power supply system as represented by a specific insulation resistance value, the connected high-resistance resistors and the nominal voltage of the IT power supply system.

Advantageously, the current displacement voltage is determined and the power supply system is shut off in case of an exceedance of the displacement-voltage limit value by means of a voltage relay.

To monitor the current displacement voltage, this embodiment employs a voltage relay that disconnects the power supply if the displacement-voltage limit value is exceeded.

Alternatively, the current displacement voltage is determined by means of a voltage measuring function integrated in an insulation monitoring device and the power supply system is shut off in case of an exceedance of the displacement-voltage limit value by means of a shut-off means.

Advantageously, determination of the current displacement voltage can be performed in an extended insulation monitoring device having an integrated voltage measuring function. In this case, shut-off of the power supply system happens in connection with a shut-off means.

In a fourth alternative, the object is attained by a method that comprises the following method steps according to the invention: connecting a capacitance between each active conductor and ground, determining a current total capacitance of the power supply system, checking whether the current total capacitance falls short of a limit value, and signaling of a shortfall.

One capacitance is connected between each active conductor and ground close to the load. The capacitances introduced each have a capacitance value that is high enough for their presence to result in a measurable contribution to the current total capacitance, but not high enough for the electrical properties of the network determined by the existing leakage capacitances to be substantially influenced.

In case of an interruption of at least one active conductor, the capacitance additionally introduced is disconnected and the value of the total capacitance of the power supply system decreases.

During operation of the installation, the current total capacitance of the power supply system is continuously determined at the feeding side. The current total capacitance obtained is checked as to whether it falls short of a total-capacitance limit value, and a shortfall, if present, is signaled.

In another embodiment, the total-capacitance limit value is defined as a function of leakage capacitances specific to the power supply system and as a function of the connected capacitances.

The total-capacitance limit value is derived from the leakage capacitances characterizing the IT power supply system and from the additional capacitances connected close to the load.

Furthermore, the current total capacitance is determined by means of a capacitance measuring device and/or by means of an insulation monitoring device having an integrated capacitance measuring function.

If the total capacitance falls short of the total-capacitance limit value, the power supply system is shut off.

In a fifth alternative, the object is attained by a method that comprises the following method steps according to the invention: connecting a capacitance having a sufficiently high capacitance value between each active conductor and ground, determining a current total impedance of the power supply system, checking whether the current total impedance exceeds a limit value, and signaling an exceedance.

As in the fourth alternative, one capacitance is connected between each active conductor and ground close to the load, said capacitance having a sufficiently high capacitance value.

Contrary to the fourth alternative, however, a current total impedance is determined and the current total impedance is checked as to whether it exceeds a total-impedance limit value.

As in the fourth alternative, the total-impedance limit value is defined as a function of an insulation resistance value specific to the power supply system and as a function of leakage capacitances specific to the power supply system and as a function of the connected capacitances.

Advantageously, the current total impedance is determined by means of an impedance measuring device and/or by means of an insulation monitoring device having an integrated impedance measuring function.

In particular the use of an insulation monitoring device having an integrated impedance measuring function simplifies the application of the method according to the fifth alternative solution.

If the total-impedance limit value is exceeded, the power supply system is shut off.

Furthermore, the object is attained by a method that executes at least two of the methods according to claims 1, 3, 6, 10 and 14 for redundant detection of the interruption of the active conductor.

To increase the reliability of the detection of the conductor interruption, a method based on determining the total insulation resistance according to the second alternative (claim 3) and a method based on determining the displacement voltage according to the third alternative (claim 6) are simultaneously implemented and executed, for example.

BRIEF DESCRIPTION OF THE DRAWING FIGURES

Figure 2:
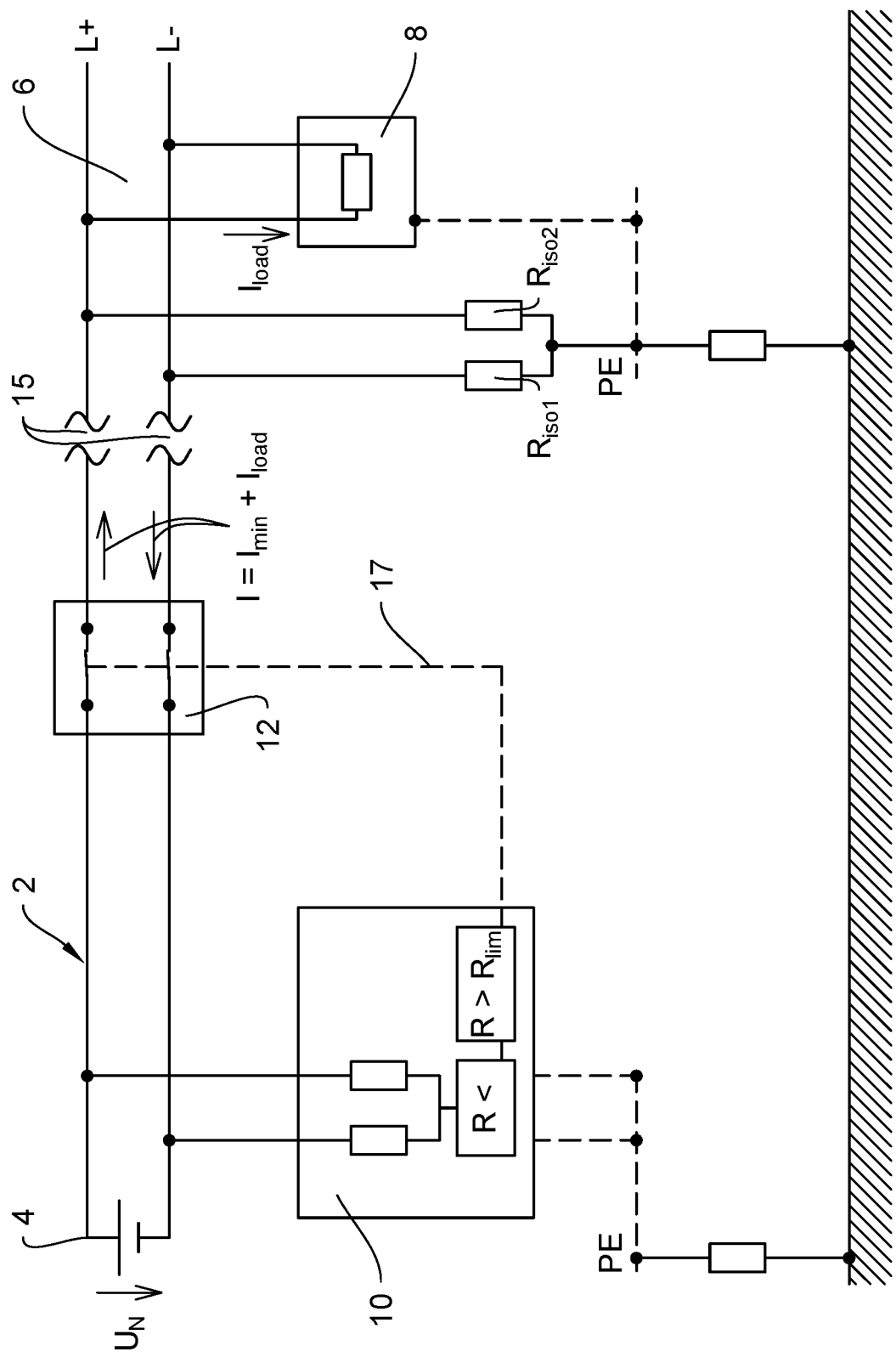
Figure 3:
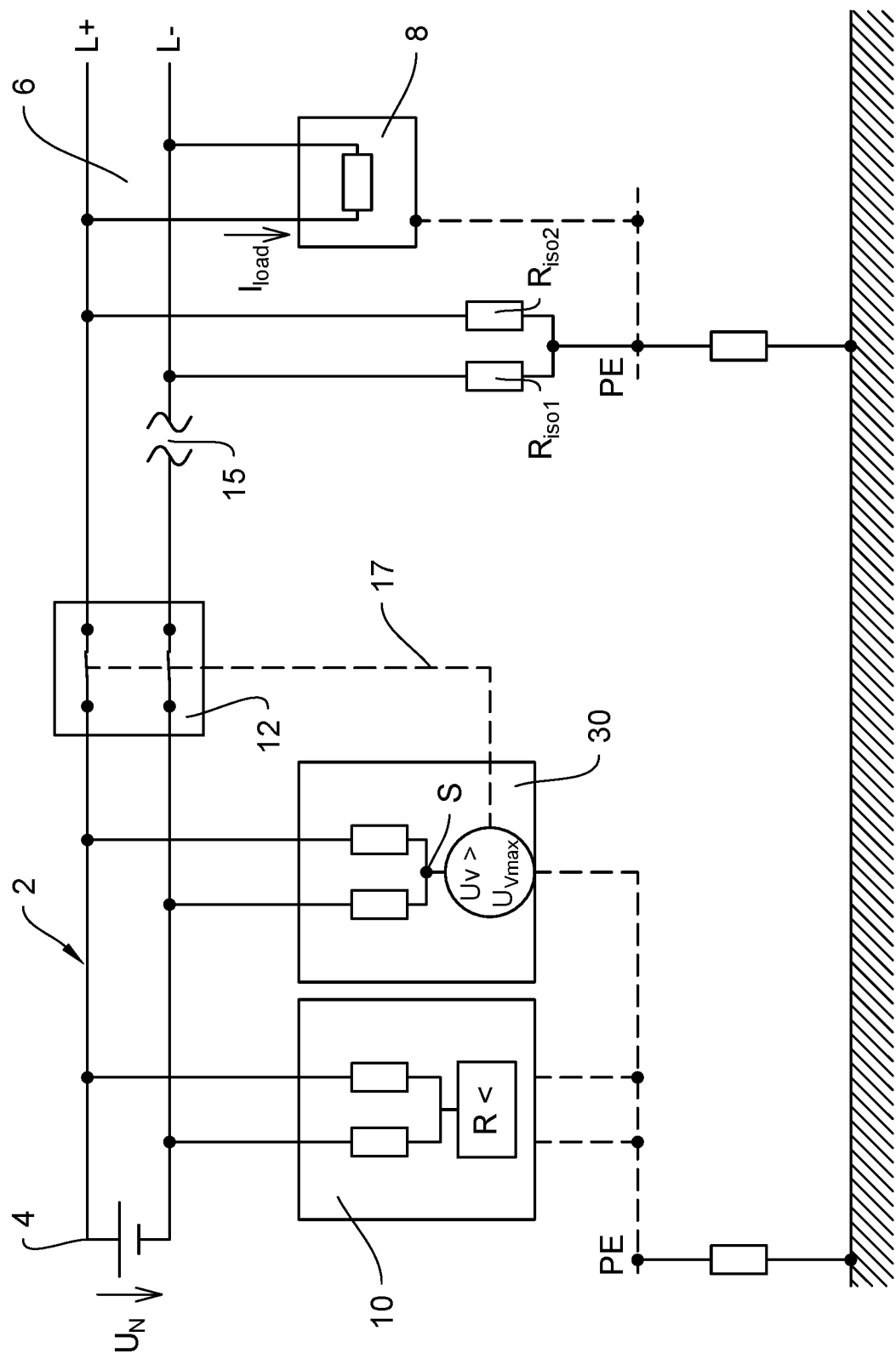
Figure 4:
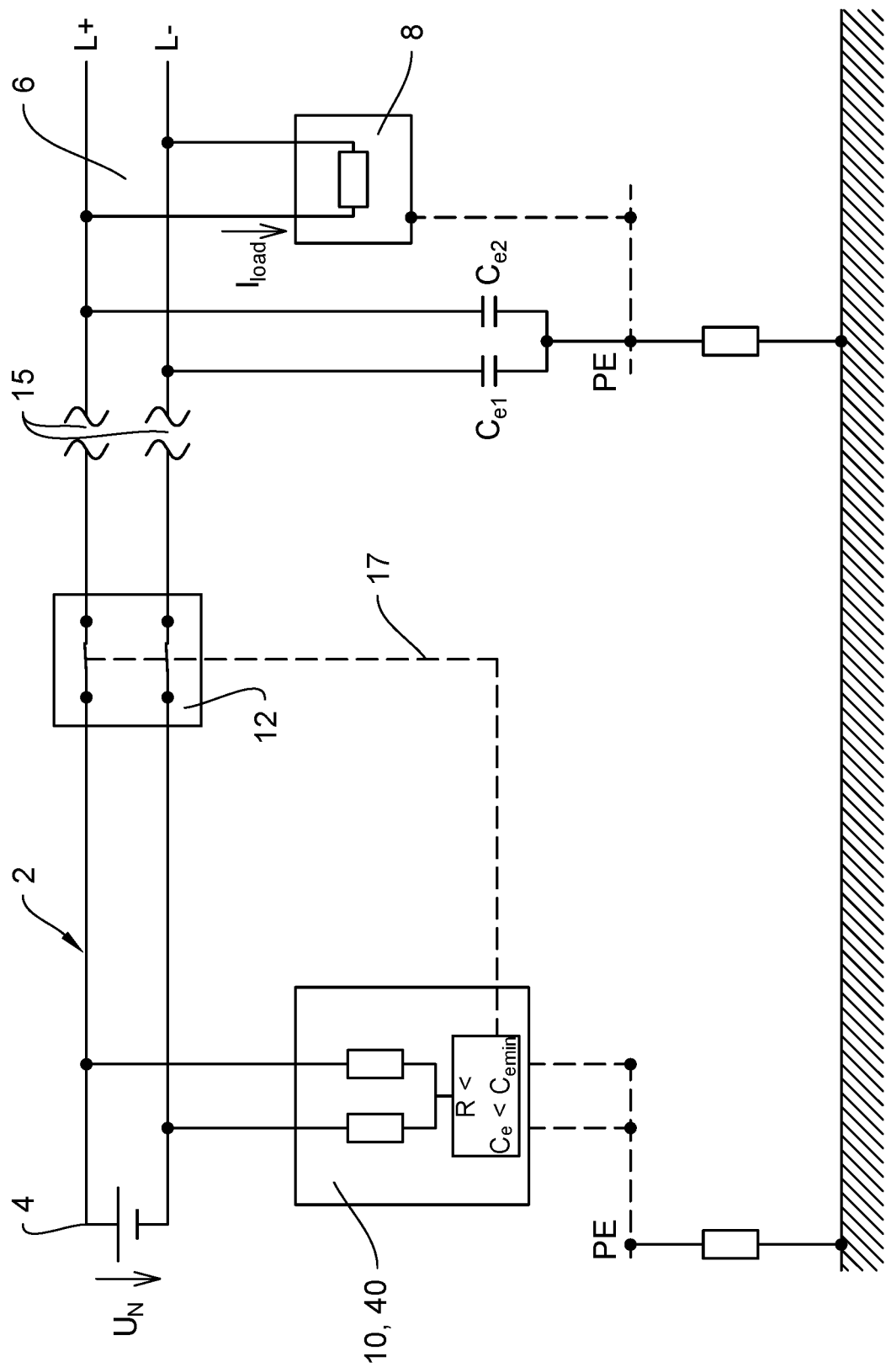
Figure 5:
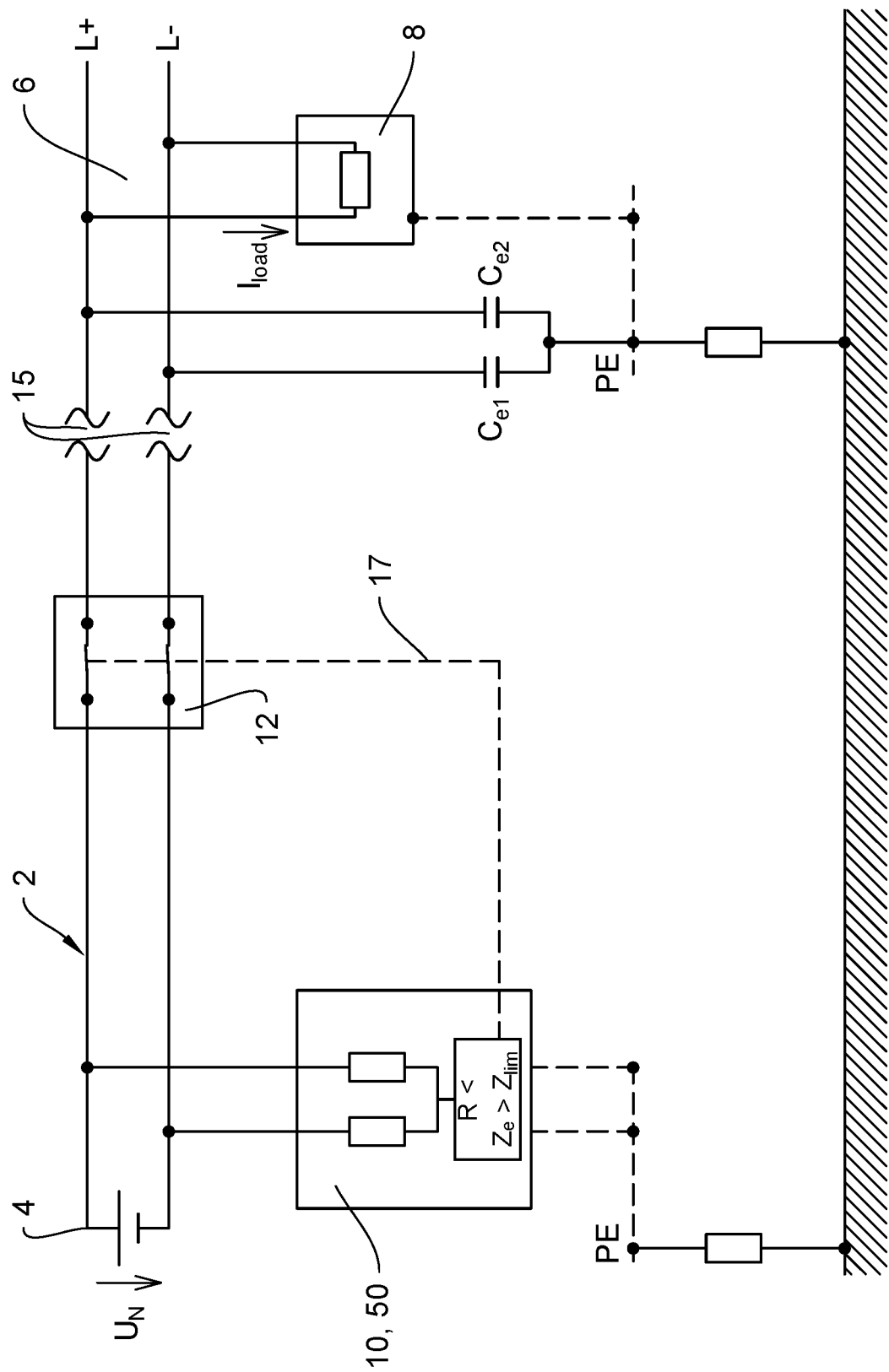

Other advantageous embodiment features become apparent from the following description and from the drawings, which illustrate preferred applications of the invention with the aid of examples. In the drawings:

FIG. 1: shows an ungrounded direct-voltage power supply system in which a current load current is determined, FIG. 2: shows an ungrounded direct-voltage power supply system in which a current total insulation resistance is determined, FIG. 3: shows an ungrounded direct-voltage power supply system in which a current displacement voltage is determined, FIG. 4: shows an ungrounded direct-voltage power supply system in which a current total capacitance is determined, and FIG. 5: shows an ungrounded direct-voltage power supply system in which a current total impedance is determined.

DETAILED DESCRIPTION

In the embodiment illustrated in FIG. 1 to FIG. 5, each of the claimed alternative solutions is based on an ungrounded direct-voltage power supply system 2 (DC-IT power supply system) which has two active conductors L+, L− which are subjected to a nominal voltage $U_N$ at a feeding point 4.

At a load connection point 6, a load 8 (equipment) is connected to the active conductors L+, L−. The DC-IT power supply system 2 is monitored as prescribed by an insulation monitoring device 10 which is connected between the active conductors L+, L− and ground PE.

The DC-IT power supply system 2 is shut off by a shut-off means 12. In FIG. 1 to FIG. 5, the shut-off means 12 is to be understood as a functional unit, which can be realized as an independent device or which can be integrated into other measuring and monitoring devices connected to the DC-IT power supply system 2.

In FIG. 1, an ohmic minimal load 14 connected between the active conductors L+, L− in conjunction with a determination of a current load current I is illustrated as the first alternative solution. The minimal load 14 is to be connected as close to the load as possible, but at least far enough away from the shut-off means 12 for a desired line section that is to be monitored and on which a potential line break 15 can occur to be located between the shut-off means 12 and the load connection point 6 of the minimal load 14.

The minimal load 14 generates a minimal load current $I_{min}$, which runs through the active conductors L+, L− from and to the feeding point 4 even in case of a deactivated load 8 and thus serves to detect a functioning line.

Together with a load current $I_{load}$ running via the load 8, the minimal load current $I_{min}$ forms a current load current I. Said current load current I is detected by a current measuring means 16 on one of the active conductors L+, L− and checked as to whether it falls short of the value of the minimal load current $I_{min}$. In case of a line break 15 on at least one active conductor L+, L−, the current load current I recedes to a magnitude close to zero and thus falls short of the value of the minimal load current $I_{min}$. This is detected and signaled by a current measuring means 16, said signaling comprising the generation of a shut-off signal 17 for triggering the shut-off means 12.

FIG. 2 shows a high-resistance resistor $R_{iso1}$, $R_{iso2}$ connected between each active conductor L+, L− and ground PE in conjunction with a determination of a current total insulation resistance $R_{iso}$ of the power supply system 2 by means of an insulation monitoring device 10 as the second alternative solution.

If a line break 15 occurs upstream of the connection point of the introduced high-resistance resistors $R_{iso1}$, $R_{iso2}$ (viewed from the feeding point 4), the current total insulation resistance R of the power supply system 2 increases as a consequence of the disconnection of at last one of the current paths running via the introduced resistors $R_{iso1}$, $R_{iso2}$. The exceedance of a predefined total-insulation-resistance limit value $R_{lim}$ by the current total insulation resistance R is detected by the insulation monitoring device 10 and is signaled to the shut-off means 12 in the form of the shut-off signal 17.

In FIG. 3, a high-resistance resistor $R_{iso1}$, $R_{iso2}$ connected between each active conductor L+, L− and ground PE in conjunction with a determination of a current displacement voltage $U_V$ between an interconnected point S of all active conductors L+, L− and ground PE is illustrated as the third alternative solution.

As in the second alternative solution, the high-resistance resistors $R_{iso1}$, $R_{iso2}$ are connected between the active conductors L+, L− and ground PE close to the load.

At the feeding side, the current displacement voltage $U_V$ is determined between an interconnected point S of all active conductors L+, L− and ground PE by means of a device having a voltage measuring function 30. An interruption 15 of at least one active conductor L+, L− leads to a raised value of the displacement voltage $U_V$, allowing a hazardous state to be signaled and transmitted to the shut-off means 12 in the form of a shut-off signal 17 if the displacement-voltage limit value $U_{Vmax}$ is exceeded.

FIG. 4 shows a capacitance $C_{e1}$, $C_{e2}$ connected between each active conductor L+, L− and ground PE in conjunction with a determination of a current total capacitance $C_e$ of the power supply system 2.

The introduction of the capacitances $C_{e1}$, $C_{e2}$ close to the load causes an increase of the current total capacitance $C_e$ of the power supply system 2 during normal operation. Consequently, a disconnection of the introduced capacitances $C_{e1}$, $C_{e2}$ can be detected as a drop of the current total capacitance $C_e$ by a device having a capacitance measuring function 40. In the illustrated embodiment example, the capacitance measuring function 40 is integrated into the insulation monitoring device 10.

If the current total capacitance $C_e$ falls short of a total-capacitance limit value $C_{emin}$, this is detected and signaled by means of a shut-off signal 17.

The fifth alternative solution, shown in FIG. 5, differs from the fourth alternative merely in that a current total impedance $Z_e$ is evaluated instead of the current total capacitance $C_e$. The comparison of the determined current total impedance $Z_e$ with a total-impedance limit value $Z_{emin}$ can advantageously be performed in an insulation monitoring device 10 having an integrated impedance measuring function 50. The total impedance against ground can be monitored at a network frequency of 50 Hz, for example. If an impedance increase due to a line break 15 is detected, the current total impedance $Z_e$ exceeding the total-impedance limit value $Z_{lim}$, the insulation monitoring device 10 sends a shut-off signal 17 to the shut-off means 12.

The invention claimed is:

1. A method for detecting an interruption of an active conductor (L+, L−) in an ungrounded direct-voltage power supply system (2), comprising the method steps of:
    connecting an ohmic minimal load (14) to generate a minimal load current (Imin) on the active conductors (L+, L−),
    determining a current load current (I),
    checking whether the current load current (I) falls short of the value of the minimal load current (Imin), and signaling a shortfall.

2. The method according to claim 1, characterized in that if the load current falls short of the minimal load-current value (Imin), the power supply system (2) is shut off by means of an undercurrent relay.

3. A method for detecting an interruption of an active conductor (L+, L−) in an ungrounded direct-voltage power supply system (2), comprising the method steps of:
    connecting a high-resistance resistor (Riso1, Riso2) between each active conductor (L+, L−) and ground,
    determining a current total insulation resistance (R) of the power supply system (2) by means of an insulation monitoring device (10),
    checking whether the current total insulation resistance (R) exceeds a limit value (Rlim), and signaling an exceedance.

4. The method according to claim 3, characterized in that the total insulation-resistance limit value (Rlim) is defined as a function of an insulation resistance value specific to the power supply system and as a function of the connected high-resistance resistors (Riso1, Riso2).

5. The method according to claim 3, characterized in that if the total insulation resistance exceeds the limit value (Rlim), the power supply system (2) is shut off.

6. A method for detecting an interruption of an active conductor (L+, L−) in an ungrounded direct-voltage power supply system (2), comprising the method steps of:
    placing a high-resistance resistor between each active conductor (L+, L−) and ground close to a load,
    determining a current displacement voltage (UV) between an interconnected point of all active conductors (L+, L−) and ground,
    checking whether the current displacement voltage (UV) exceeds a limit value (UVmax), and signaling an exceedance.

7. The method according to claim 6, characterized in that the displacement-voltage limit value (UVmax) is defined as a function of an insulation resistance value specific to the power supply system and as a function of the connected high-resistance resistors and as a function of a nominal voltage (UN) of the power supply system (2).

8. The method according to claim 6, characterized in that the current displacement voltage (UV) is determined and the power supply system (2) is shut down in case of an exceedance of the displacement-voltage limit value (UVmax) by means of a voltage relay.

9. The method according to claim 6, characterized in that the current displacement voltage (UV) is determined by means of a voltage measuring function (30) integrated in an insulation monitoring device (10) and the power supply system (2) is shut off by means of a shut-off means in case of an exceedance of the displacement-voltage limit value (UVmax).

10. A method for detecting an interruption of an active conductor (L+, L−) in an ungrounded direct-voltage power supply system (2), comprising the method steps of:
    connecting a capacitance (Ce1, Ce2) between each active conductor (L+, L−) and ground,
    determining a current total capacitance (Ce) of the power supply system (2),
    checking whether the current total capacitance (Ce) falls short of a limit value (Cemin), and signaling a shortfall.

11. The method according to claim 10, characterized in that the total capacitance limit value (Cemin) is defined as a function of leakage capacitances specific to the power supply system and as a function of the connected capacitances (Ce1, Ce2).

12. The method according to claim 10, characterized in that the current total capacitance (Ce) is determined by means of a capacitance measuring device and/or by means of an insulation monitoring device having an integrated capacitance measuring function.

13. The method according to claim 10, characterized in that if the total capacitance falls short of the limit value (Cemin), the power supply system (2) is shut off.

14. A method for detecting an interruption of an active conductor (L+, L−) in an ungrounded direct-voltage power supply system (2), comprising the method steps of:
  connecting a capacitance (Ce1, Ce2) between each active conductor (L+, L−) and ground,
  determining a current total impedance (Ze) of the power supply system (2),
  checking whether the current total impedance (Ze) exceeds a limit value (Zlim), and signaling an exceedance.

15. The method according to claim 14, characterized in that the total impedance limit value (Zlim) is defined as a function of an insulation resistance value specific to the power supply system and as a function of leakage capacitances specific to the power supply system and as a function of the connected capacitances (Ce1, Ce2).

16. The method according to claim 14, characterized in that the current total impedance (Ze) is determined by means of an impedance measuring device and/or by means of an insulation monitoring device (10) having an integrated impedance measuring function (50).

17. The method according to claim 14, characterized in that if the total impedance exceeds the limit value (Zlim), the power supply system (2) is shut off.

18. A method for determined an interruption of an active conductor (L+, L−) in an underground direct-voltage power supply system (2), characterized in that at least two of the following methods A-E are executed for redundant detection of the interruption of the active conductor:
  A. connecting an ohmic minimal load (14) to generate a minimal load current (Imin) on the active conductors (L+, L−),
    determining a current load current (I),
    checking whether the current load current (I) falls short of the value of the minimal load current (Imin), and signaling a shortfall;
  B. connecting a high-resistance resistor (Riso1, Riso2) between each active conductor (L+, L−) and ground,
    determining a current total insulation resistance (R) of the power supply system (2) by means of an insulation monitoring device (10),
    checking whether the current total insulation resistance (R) exceeds a limit value (Rlim), and signaling an exceedance;
  C. connecting a high-resistance resistor between each active conductor (L+, L−) and ground,
    determining a current displacement voltage (UV) between an interconnected point of all active conductors (L+, L−) and ground,
    checking whether the current displacement voltage (UV) exceeds a limit value (UVmax), and signaling an exceedance;
  D. connecting a capacitance (Ce1, Ce2) between each active conductor (L+, L−) and ground,
    determining a current total capacitance (Ce) of the power supply system (2),
    checking whether the current total capacitance (Ce) falls short of a limit value (Cemin), and signaling a shortfall; or
  E. connecting a capacitance (Ce1, Ce2) between each active conductor (L+, L−) and ground,
    determining a current total impedance (Ze) of the power supply system (2),
    checking whether the current total impedance (Ze) exceeds a limit value (Zlim), and signaling an exceedance.

* * * * *